March 1, 1966 J. S. SCHAFFNER 3,238,386

ELECTRONIC SWITCHING DEVICE

Filed Oct. 9, 1963 3 Sheets-Sheet 1

INVENTOR.
JOHANNES S. SCHAFFNER
BY
Kenyon & Kenyon
ATTORNEYS

March 1, 1966 J. S. SCHAFFNER 3,238,386
ELECTRONIC SWITCHING DEVICE
Filed Oct. 9, 1963 3 Sheets-Sheet 2

INVENTOR.
JOHANNES S. SCHAFFNER
BY
Kenyon & Kenyon
ATTORNEYS

INVENTOR.
JOHANNES S. SCHAFFNER
BY
Kenyon & Kenyon
ATTORNEYS

United States Patent Office 3,238,386

Patented Mar. 1, 1966

3,238,386

ELECTRONIC SWITCHING DEVICE

Johannes S. Schaffner, Hans Huberstrasse 33, Solothurn, Switzerland

Filed Oct. 9, 1963, Ser. No. 315,007
5 Claims. (Cl. 307—88.5)

This invention relates in general to electronic switches and more specifically to a transistorized relay having multiple outputs controlled by a single input.

Electronic devices with two output electrodes are called electronic switches if, when supplied with the proper signal, the device will either be in a conducting state or in a non-conducting state.

Electronic switches can broadly be considered of two types. The first type has two output electrodes and, in addition, a control electrode, to which control electrode the proper signal must be applied to affect the state of the two output electrodes. The conducting state corresponds to the closed state while the non-conducting state corresponds to the open state. It is this first type of electronic switch (i.e. one having a control electrode) to which this invention is addressed. The second type of electronic switch is one that has only two output electrodes and no control electrodes. In this second type of electronic switch, the signal that controls the state of the device must be added to whatever voltage is applied to the output electrode. This signal voltage may, for this second type of switch, consist of a high voltage excursion of short duration. A four layer diode is an example of this second type of switch. Transistors and thyristor electronic switches consisting of semi-conductor devices are examples of the first type of switch. For transistors, the emitter and the collector are the output electrodes and the base is the control electrode. For thyristors, anode and cathode are the output electrodes while the gate is the control electrode.

In the circuits to be described further on herein, it shall be understood that voltages and resistances are selected so that a transistor in the conducting state shall be in saturation. It shall be understood that the input signals used to switch the state of these transistor switches shall be of sufficient magnitude to place the transistors in saturation.

In control applications it may be desirable to use electronic switches that have either several independent inputs or several independent outputs, since this will result in a savings in components. For example, with transistor switches, so called logic elements have been constructed that have several independent inputs and one output. All inputs of these elements have one terminal in common with one another and with the output. For this reason, the outputs or inputs of the elements of a system cannot be connected in series. By contrast electromagnetic relays have a plurality of outputs, each having two terminals. These output terminals are not electrically connected to the input terminals or to other output terminals. Therefore, they can be connected in series or in parallel. This property is used in control circuits consisting of electromagnetic relays and leads to a considerable saving in switching elements.

Accordingly, it is a major purpose of this invention to provide an electronic switching device having a number of output terminals all of which are electrically independent of one another so that they may be arranged as desired in series and/or in parallel.

In broad terms, it is a purpose of this invention to provide electronic switching elements which have certain of the advantages of an electromagnetic relay while retaining the advantages of an electronic device having no moving elements.

In brief, the electronic switching unit of this invention involves the use of one type of transistor, such as an NPN transistor, to control the state of the complementary (i.e. PNP) type of transistor. An input circuit is designed around a normally non-conducting NPN transistor in such a fashion that when a signal of the appropriate magnitude and polarity is applied to the base of the transistor, this input transistor will become conducting. A plurality of PNP transistors are employed as the actual output contacts. In particular, the emitter and collector of each PNP transistor operate as the output contacts in the switch of this invention. The base of this output PNP transistor is coupled to the collector of the NPN transistor. Thus the turning on of the NPN transistor by the appropriate positive input signal will apply a voltage, to the base of the output PNP power transistors, of such a magnitude and polarity as to cause the PNP transistors to be turned on when the appropriate voltages are applied between the emitter and collector of any one or more of these transistors. By this use of complementary transistors, it becomes possible to control the state of a bank of output transistors while leaving the collector and emitter of each output transistor electrically independent of the collectors and emitters of all the other output transistors. Thus it becomes possible to treat the collectors and emitters of these output transistors in much the same fashion as one treats the mechanical contacts on an electromagnetic relay.

Other objects and purposes of this invention will become apparent from a consideration of the following detailed description and drawings in which.

Figure 1:
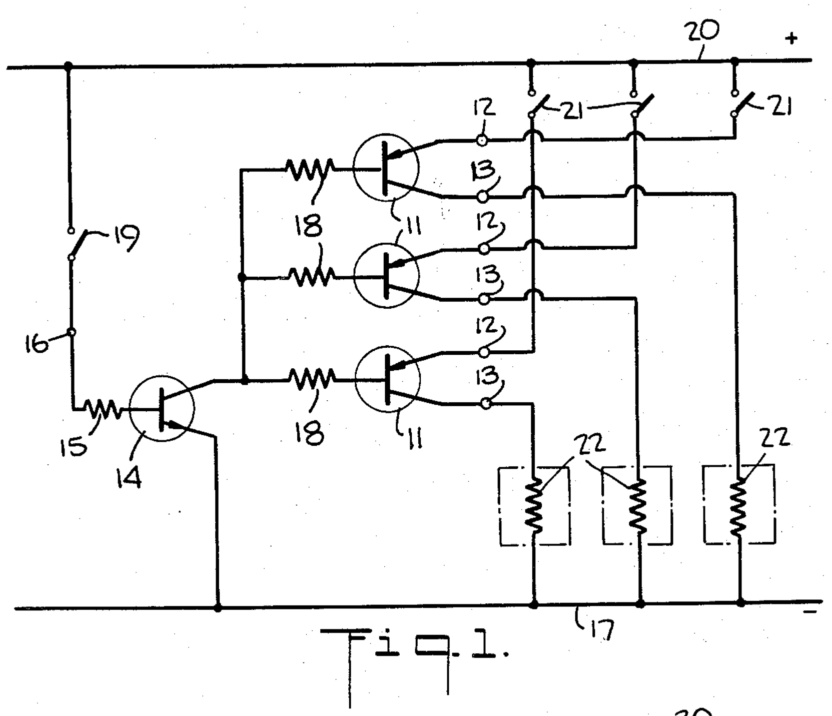
FIG. 1 is a simplified schematic illustrating a first realization of this invention, a realization which is analogous to a relay for direct current operation with contacts that are open when no voltage is applied to the input terminal.

In FIG. 1, the PNP transistors 11 are the electronic parts which operate as the normally open contacts. These contacts are designed by the numerals 12 and 13, the emitter electrodes of the transistors 11 constituting the contacts 12 and the collector electrodes constituting the contacts 13. It will be convenient herein to refer to transistors 11 as the output transistors and to the transistors plus whatever associated circuitry is employed as the output circuit portion of the switching device of this invention.

The state of the PNP output transistors 11 is determined by the state of an NPN transistor 14. Again, for convenience herein, this transistor 14 will frequently be referred to as an input transistor and the circuitry associated with it plus the transistor 14 will be referred to as an input circuit. A base resistor 15 is illustrated between the base of the transistor 14 and what will be arbitrarily termed input terminal 16. The NPN transistor 14 emitter is connected directly to a negative bus bar 17 while the transistor 14 collector is connected through the base resistors 18 to the base electrodes of the output transistors 11. A switch 19 is employed to permit connecting the base of the input transistor 14 to the positive bus bar 20. This switch 19 is in lieu of a positive input triggering signal at the input terminal 16 and is employed for purposes of illustrating how this invention works. Similarly, switches 21 are employed to permit connecting the emitters of the output transistors 11 to the positive bus bar 20.

If the switch 19 is closed, a positive signal on the base of the NPN transistor 14 will turn that transistor on and a base-emitter current will tend to flow through the transistor 14 from the positive bus bar 20 to the negative bus bar 17. The transistor 14 being on will be in its conducting state. As long as the collector current in the transistor 14 is kept below a critical value, the voltage drop across the transistor 14 will be sufficiently small so that, as a first approximation, the collector of the transistor 14 can be deemed to have the same electrical potential as that of its emitter, which is the potential of the negaive bus bar 17. If $h_{FE}$ is the current amplification of the transistor 14 and if $I_B$ is the current flowing into its base electrode, the voltage drop of transistor 14 will remain small, as above presumed, as long as the collector current is kept below $h_{FE}$ $I_B$. The magnitude of elements such as the resistors 18 is selected in such a fashion as to keep the collector current in the transistor 14 below this critical value.

If the switches 21 are now closed, the emitters of the output transistors 11 will be placed at the positive bus bar 20 potential and the negative bus bar 17 potential which is applied to the bases of the output transistors 11 will cause these transistors 11 to be turned on. Thus, the turning on of the input transistor 14 supplies a negative voltage to the bases of the PNP output transistors 11 that enables these output transistors 11 and permits them to be turned on when the appropriate voltage is applied to the output terminals 12, 13 of these transistors 11. The load 22 illustrated is represented as a general load in order to broadly indicate whatever circuitry it is that is controlled by the electronic contacts 12 and 13.

If a voltage between the negative bus bar 17 and positive bus bar 20 is designated as $U_o$, then a current of approximately $U_o/R_{18}$ will flow in the resistor 18 where "$R_{18}$" represents the numerical value of this resistor 18. If $h_{FEO}$ is the current amplification of the transistors 11, then the voltage drop between the output terminals 12, 13 of the transistors 11 will be low as long as the external elements, such as the load 12, limit the collector current to a value below $U_o h_{FEO}/R_{18}$.

It should be noted that even if switches 21 are left closed, this circuit can be designed so that as long as the switch 19 is open, the output terminals 12 and 13 will not be closed. If switch 19 is open, no base current will flow into transistor 14. Thus, the current flowing in the collector electrode of the transistor 14 is limited to the current generated thermally, which at moderate temperatures, is quite low. This current flowing into the base electrode of the transistors 11 will in turn generate a low current in these transistors when the switches 11 are closed but, if the transistors 11 and 14 are chosen correctly, this current will not be sufficient to close the contacts 12 and 13. More specifically this current will be insufficient to cause the transistor 11 to be turned on.

It might also be noted that the loads 22 could be constituted by another switching unit identical to that illustrated in FIG. 1 where that switching unit would be connected to the output terminal 13 at its own input terminal 16.

Figure 2:
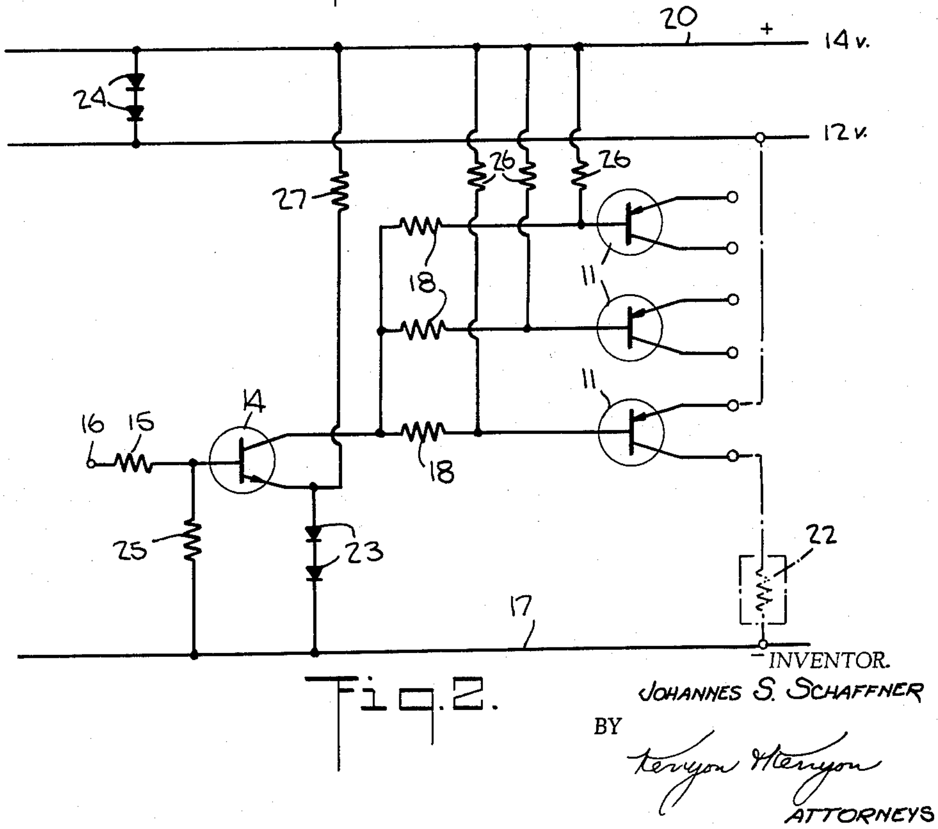
FIG. 2 is similar to the circuit of FIG. 1 with the addition of a certain circuitry to reduce leakage current and thus enable operation of a wider temperature range.

The circuit of FIG. 2 functions similarly to the circuit of FIG. 1. The additional parts are included primarily to reduce leakage currents. Accordingly, in FIG. 2, the notation of FIG. 1 is carried over to denote those parts which operate in substantially the same fashion as has already been described in connection with FIG. 1. When the input transistor 14 is off, the resistor 25 at the base of this NPN transistor 14 couples the base to the negative bus bar 17 thereby tending to bias that transistor hard off. Similarly, the diodes 23 and resistor 27 are connected to the bus bars 17 and 20 as well as to the emitter of the NPN input transistor 14 in such a fashion as to apply a positive voltage to that emitter so that when the transistor 14 is off, it tends to be biased hard off. The diodes 24 and base resistors 26 operate in a similar fashion to bias the PNP output transistors 11 hard off when they are non-conducting by applying a positive voltage to the bases and a negative voltage to the emitters of these PNP transistors 11. Other methods for reducing leakage currents are known in the art and need not be described here.

Figure 3:
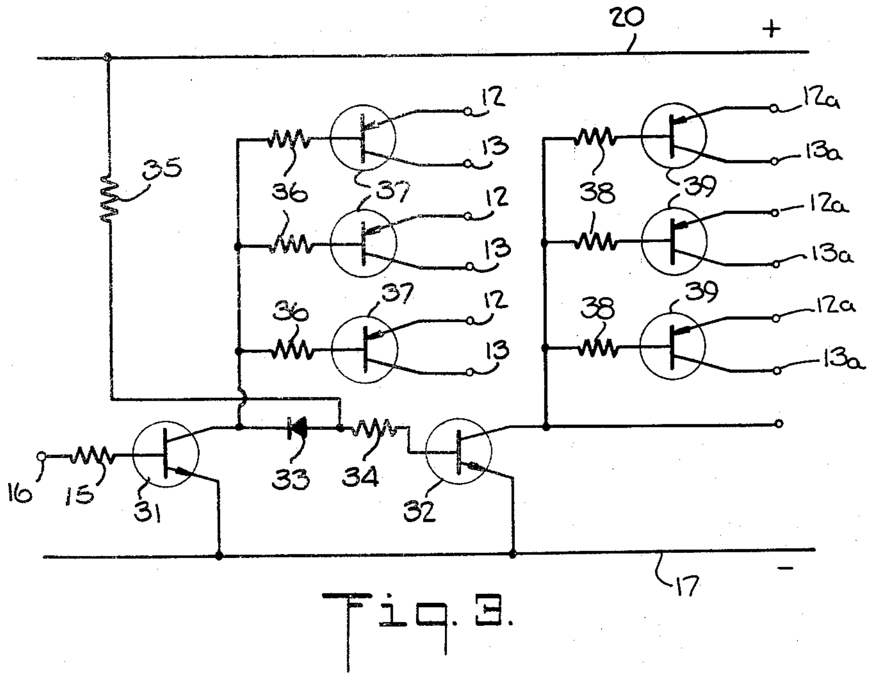
FIG. 3 is a schematic illustrating a second embodiment of this invention, an embodiment that is analogous to a D.C. relay having both normally closed and normally open contacts.

The fundamental operation of the switching device of FIG. 3 is similar to that of the switching device of FIGS. 1 and 2 in that complementary input and output transistors are coupled together to provide a simple and stable electronic switching device. However, the input circuit in FIG. 3 contains two transistors 31 and 32 arranged so that one or the other of these two input transistors is always on but only one may be on at a time. Since the NPN input transistor 31 is normally off, the associated PNP output transistors 37 will be normally off and their emitter and collector output contacts will be normally open. Similarly, since the NPN input transistor 32 is normally conducting, the associated PNP output transistors 39 will be in a condition such that current will be conducted from its emitter to its collector when the appropriate voltages are applied and thus the terminals constituted by its emitter and collector will be normally closed.

The input circuit which includes the two transistors 31 and 32 also includes the diode 33 and the two resistors 34 and 35 as shown.

With no positive input signal at the input terminal 16, the transistor 31 is off. The positive bias on the positive bus bar 20 will thus be coupled by the resistors 35 and 34 to the base of the NPN transistor 32 tending to turn that transistor on. The transistor 32 will, of course, not actually be turned on (in the sense that collector current will flow, as contrasted with being enabled) unless the emitter of at least one of the associated output PNP transistors 39 is coupled to the positive bus bar 20. But, when the switching device is placed in operation, at least one transistor 39 emitter will be coupled to the positive bus bar 20 so that a circuit will be completed from the negative bus bar 17 to the transistor 32, the resistor 38 and one or more transistors 39 to the positive bus bar 20. Since the turning on of the transistor 32 will substantially apply the negative bus bar 17 voltage to the base of the PNP transistors 39, the PNP transistors will tend to be turned on and the current just indicated will be enabled to flow as an emitter-base current in the PNP transistor 39 and a collector-base current in the NPN transistor 32. When the electronic relay contacts 12a and 13a are properly connected into the circuitry that they are arranged to control, at least one of the contacts 12a associated with the output transistors 39 will be coupled to the positive bus bar 20. The other contacts 12a and 13a may be arranged in series with the one set having its contact 12a connected to the bus bar 20, or, any series-parallel arrangement may be had.

If we assume that a positive signal of the appropriate amplitude is applied near the base of the transistor of the NPN transistor 31, that transistor 31 will be turned on and the current will flow from the positive bus bar 20 through the resistor 35, the diode 33 into the collector of the transistor 31 and out its emitter to the negative bus bar 17. With the NPN transistor 31 conducting, the current through the resistor 35 will be diverted through this conducting transistor 31 thereby turning the input NPN transistor 32 off. In this fashion, an appropriate signal at the input terminal 16 will switch the state of the input transistors 31 and 32 and accordingly switch the contacts 12 and 13 from their normally open condition to a closed condition and concurrently switch the state of the contacts **12*a* and 13*a*** from their normally closed condition to an open condition.

The diode 33 is included so that, when the transistor 31 is off and the transistor 32 is conducting, a negative signal from the negative bus bar 17 will not be coupled to the base of the PNP transistors 37 which would tend to close the contacts 12 and 13 even though the transistor 31 is in its non-conducting state. The diode 33 simply prevents a flow of current from the base of the transistors 37 through the resistor 34 and the transistor 32 to the bus bar 17.

In brief, in FIG. 3, when the transistor 31 is conducting, the output transistors 37 are in their conducting state while the input transistor 32 is non-conducting so that the output transistors 39 are in their non-conducting state. Conversely, if the transistor 31 is non-conducting, the output transistors 37 are in their non-conducting state while the transistor 32 conducts and the transistors 39 are in their conducting state. Thus the circuit of FIG. 3 resembles in its behavior an electromagnetic relay with both normally open and normally closed contacts. Circuits incorporating this electronic switching device may be formed by means of placing the contacts 12 and 13 associated with the transistors 37 and the contacts **12*a* and 13*a* associated with the transistors 39** in series or in parallel or in any series or parallel combination. The circuits thus formed will be very similar to the circuits formed in control applications by means of electromagnetic relays and their contacts.

In order to permit operation of the circuit of FIG. 3 at high temperatures, certain elements will have to be added in a way similar to that shown in connection with FIG. 2 in order to reduce leakage currents.

Figure 4:
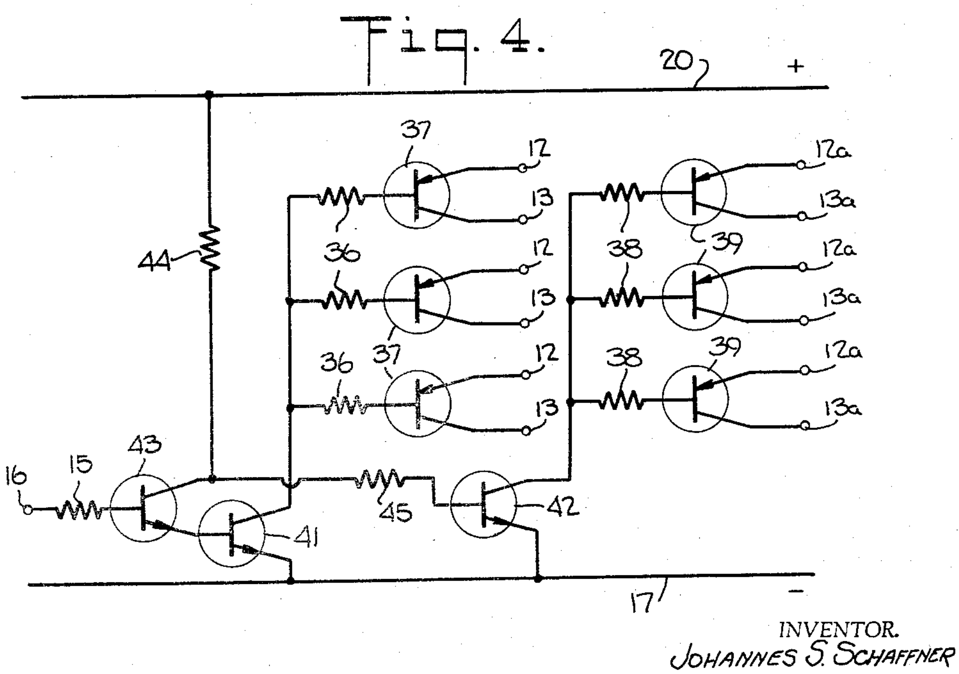
FIG. 4 is a schematic illustration of a third embodiment of this invention that corresponds to a D.C. relay having both normally open or normally closed contacts.

The switching device of FIG. 4 is similar to the switching device of FIG. 3 except that the input circuit in FIG. 4 is somewhat different. In FIG. 4 an additional NPN transistor 43 is used to control the state of the other input NPN transistors 41 and 42. In turn, the state of the transistor 43 is determined by the input signal applied at the input terminal 16.

As may be seen in FIG. 4, the emitter of the transistor 43 is connected to the base of the transistor 41 while the collector of the transistor 43 is connected to the base of the transistor 42 through the resistor 45 and to the positive bus bar 20 through the resistor 44. Under this arrangement, the transistor 43 is normally not conducting and when in that state, the transistor 41 is non-conducting while the transistor 42 is conducting. Accordingly, the output transistors 37 associated with the transistor 41 will provide normally open terminals while the transistors 39 associated with the transistor 42 will provide normally closed terminals. The appropriate positive signal at the input terminal 16 will reverse that condition by turning on the transistor 43 which will then serve to turn on the transistor 41 since the emitter of the transistor 43 will follow its base and thus apply the appropriate positive voltage to the base of the transistor 41. With the transistors 43 and 41 turned on, the diversion of current from the transistor 42 will turn it off and thus result in the appropriate change of state for all of the terminals **12*a* and 13*a* as well as the terminals 12 and 13**.

The electronic switching devices illustrated in FIGS. 1 through 4 are useful only for operation with direct currents.

Although the above disclosure illustrates four embodiments of this invention, it should be understood that there are certain variations which may be made by one skilled in this art. For example, the NPN input circuit transistors could all be replaced by PNP transistors as long as the PNP output circuit transistors were all replaced by NPN transistors and appropriate polarities reversed.

Figure 5:
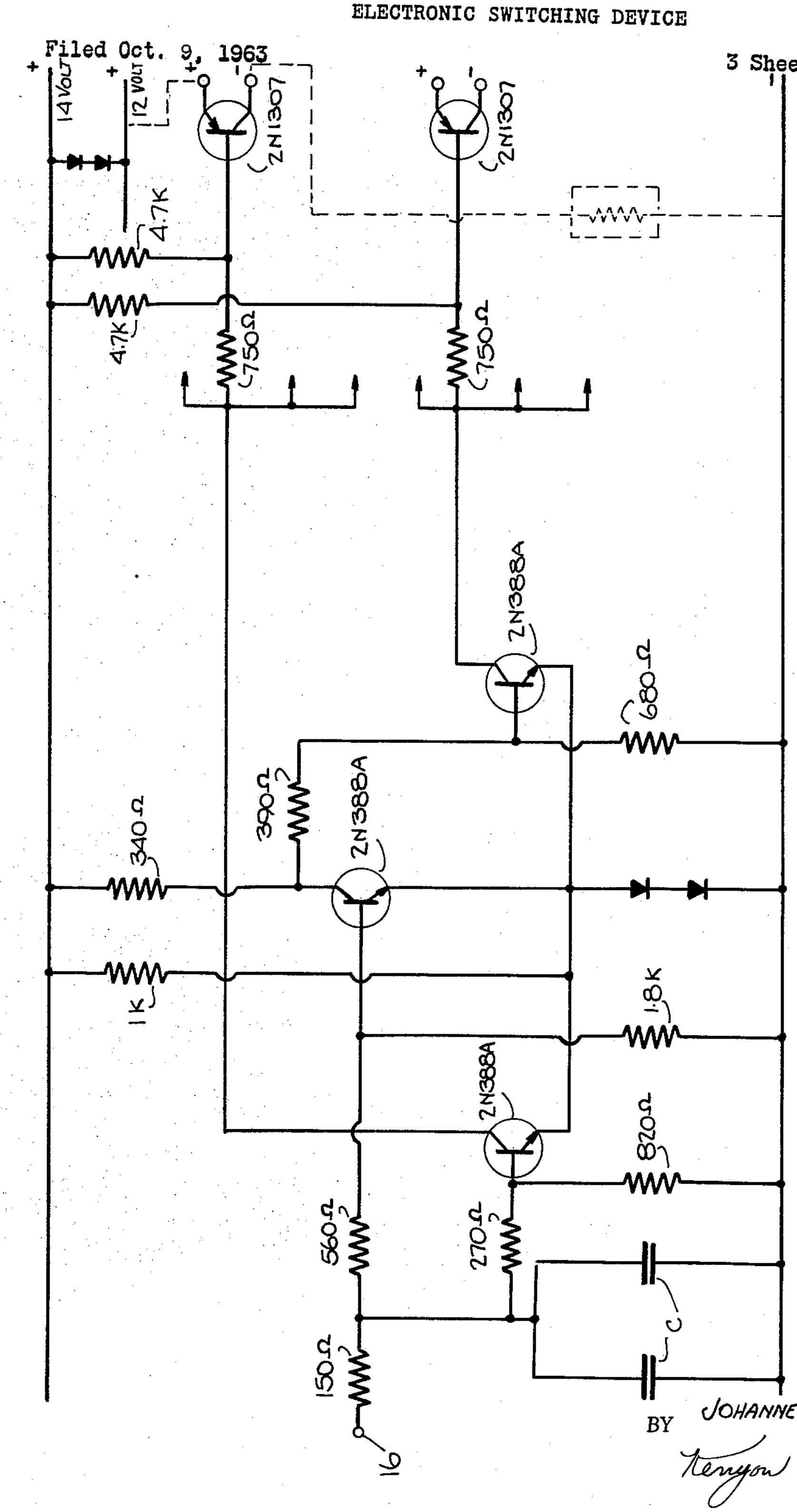
FIG. 5 is a schematic illustrating a complete practical circuit for a 12 volt relay designed in conformance with the teachings of this invention.

As a further example, FIG. 5 is included to illustrate one complete schematic of a working embodiment including circuitry for reducing leakage currents and including the values of the resistors and voltages that may be employed.

What is claimed is:

1. An electronic relay comprising:

a first input transistor adapted to undergo a change of state in response to a signal of appropriate polarity applied to its base, a second input transistor having its base coupled to the collector output of said first input transistor and adapted to undergo a change of state in response to a change of state of said first input transistor, a plurality of first output transistors complementary to said first input transistor, the base of each of said first output transistors being coupled to the collector output of said first input transistor, each of said first output transistors being adapted to undergo a change of state in response to a change of state of said first input transistor, and a plurality of second output transistors, the base of each of said second output transistors being coupled to the collector output of said second input transistor, each of said second output transistors being adapted to undergo a change of state in response to a change of state in said second input transistor, whereby an appropriate signal effective to change the state of said first input transistor will effect a change of state across the output terminals of each of said first output transistors and each of said second output transistors, and whereby the output terminals of each of said first output transistors and each of said second output transistors may be used as relay contacts.

2. An electronic relay comprising:

a first PNP transistor, a second PNP transistor, means intercoupling said first and said second PNP transistors to cause the state of said second PNP transistor to be opposite from the state of said first PNP transistor, whereby an input signal effective to change the state of said first PNP transistor will also cause a change of state of said second PNP transistor and whereby when said first PNP transistor is on, said second PNP transistor will be off and when said first PNP transistor is off, said second PNP transistor will be on, a first NPN transistor having its base coupled to the collector output of said first PNP transistor, said first NPN transistor being adapted to change its state in response to a change of state of said first PNP transistor, and a second NPN transistor having its base coupled solely to the collector output of said second PNP transistor, said second NPN transistor being adapted to change its state in response to a change of state of said second PNP transistor, whereby the collector and emitter terminals of each of said NPN transistors may be used as electronic relay terminals whose state is a function of said input signal.

3. The electronic relay of claim 2 wherein said PNP transistors are NPN transistors and said NPN transistors are PNP transistors.

4. The electronic relay of claim 2 wherein said inter-coupling means includes a diode coupled between the base of said second PNP transistor and the collector output of said first PNP transistor.

5. The electronic relay of claim 2 wherein said inter-coupling means includes a third PNP transistor, the emitter of said third PNP transistor being coupled to the base of said first PNP transistor and the collector of said third PNP transistor being coupled to the base of said second PNP transistor.

References Cited by the Examiner

UNITED STATES PATENTS 3,030,525 4/1962 Cobbold ----------- 307—88.5

FOREIGN PATENTS 1,197,123 11/1959 France.

OTHER REFERENCES

Erdman: IBM Technical Disclosure Bulletin, vol. 5, No. 11, page 50, April 1963.

ARTHUR GAUSS, *Primary Examiner.*